United States Patent [19]

Hashimoto et al.

[11] Patent Number: 5,552,949
[45] Date of Patent: Sep. 3, 1996

[54] MAGNETORESISTANCE EFFECT ELEMENT WITH IMPROVED ANTIFERROMAGNETIC LAYER

[75] Inventors: Susumu Hashimoto, Ebina; Yuzo Kamiguchi; Hitoshi Iwasaki, both of Yokohama; Atsuhito Sawabe, Yokosuka; Masashi Sahashi, Yokohama, all of Japan

[73] Assignee: Kabushiki Kaisha Toshiba, Kanagawa-ken, Japan

[21] Appl. No.: 204,676

[22] Filed: Mar. 2, 1994

[30] Foreign Application Priority Data

Mar. 3, 1993 [JP] Japan ................................. 5-043025

[51] Int. Cl.$^6$ ............................................... G11B 5/39
[52] U.S. Cl. ..................... 360/113; 324/252; 338/32 R
[58] Field of Search ................ 360/113; 428/900, 428/472, 611, 632, 928; 324/252; 338/32 R; 427/131

[56] References Cited

U.S. PATENT DOCUMENTS

| | | | |
|---|---|---|---|
| 4,103,315 | 7/1978 | Hempstead et al. | 360/110 |
| 4,755,897 | 7/1988 | Howard | 360/113 |
| 4,785,366 | 11/1988 | Krounbi et al. | 360/113 |
| 5,014,147 | 5/1991 | Parkin et al. | 360/113 |
| 5,164,025 | 11/1992 | Hasegawa | 148/313 |
| 5,287,237 | 2/1994 | Kitada et al. | 360/113 |
| 5,315,468 | 5/1994 | Lin et al. | 360/113 |
| 5,390,061 | 2/1995 | Nakatani et al. | 360/113 |
| 5,436,777 | 7/1995 | Soeya et al. | 360/113 |

FOREIGN PATENT DOCUMENTS 5-315134  11/1993  Japan.

OTHER PUBLICATIONS

Bajorek et al, *Cobalt–Chromium Films For Hard Magnetic Biasing of Magnetoresistive Sensors and For Magnetic Recording Medium*, Mar. 1979, IBM Technical Disclosure Bulletin, vol. 21, No. 10, pp. 4239–4240.

Alberts et al, *A Magnetoelastic Study of Cr—Fe alloys*, Apr./1992, Journal of Physics: Condens. Matter, pp. 3835–3846.

*Primary Examiner*—Stuart S. Levy
*Assistant Examiner*—William R. Korzuch
*Attorney, Agent, or Firm*—Finnegan, Henderson, Farabow, Garrett & Dunner, L.L.P.

[57] ABSTRACT

An exchange coupled film is presented, which has an antiferromagnetic film being made of $N_{100-z}Mn_z$ (where N is at least one selected from the group consisting of Cu, Ru, Rh, Re, Pd, Pt, Ag, Au, Os, and Ir; and $24 \leq z \leq 75$) and having a tetragonal crystalline structure or being made of $Cr_{100-x}M_x$ (where M is at least one selected from the group consisting of elements of group 3b of periodic table, Cu, Ru, Rh, Re, Pt, Pd, Ag, Au, Os, Ir, Mn, Fe, Co, and V; and x is in the range of $0<x<30$) and a ferromagnetic film at least part of which is laminated with the antiferromagnetic film. With such an antiferromagnetic film, an exchange coupled film with a good exchange coupling characteristic and high corrosive resistance can be obtained.

10 Claims, 5 Drawing Sheets

MAGNETORESISTANCE EFFECT ELEMENT WITH IMPROVED ANTIFERROMAGNETIC LAYER

BACKGROUND OF THE INVENTION

1. Field of the Invention

The present invention relates to exchange coupled films that employ antiferromagnetic layer and ferromagnetic layer and a magnetoresistance effect element that are used for magnetic field detecting sensors, reproducing magnetic heads, and the like.

2. Description of the Related Art

For high density magnetic recording, magnetic heads that employ a magnetoresistance effect are being studied. As a material of magnetoresistance devices, an alloy thin film made of 80 atomic % of Ni and 20 atomic % of Fe (this alloy is generally referred to as permalloy) has been used. In recent years, as a substitute of this material, a multilayer film and a spin valve film such as Co/Cu with a giant magnetoresistance effect are becoming popular.

However, magnetoresistance films made of such materials have magnetic domains and thereby are particularly susceptible to Barkhausen noise. Various methods have been studied so that such magnetoresistance films have a single magnetic domain. N represents the metal which is preferably used with an exchange coupling of a magnetoresistance film, which is made of a ferromagnetic material and an antiferromagnetic material, to a predetermined direction. For example, Hempstead et al. in U.S. Pat. No. 4,103,315 for "ANTIFERROMAGNETIC-FERROMAGNETIC EXCHANGE BIAS FILMS", Abstract teach "In thin film magnetic transducers, e.g., inductive or magnetoresistance recording heads, at least a pair of layers of a ferromagnetic material and an antiferromagnetic material are deposited upon one another and exchange coupled to retain a unidirectional bias in the plane of the ferromagnetic material." In this related art reference, a FeMn alloy is used for an antiferromagnetic material.

However, the FeMn alloy tends to become corroded especially by acid. Thus, the exchange coupling force of the FeMn alloy to the magnetoresistance film degrades over time.

In addition, Hempstead et al. supra disclose γ-Mn alloys (such as MnPt alloy and MnRh alloy) and oxides (such as NiO) as antiferromagnetic materials. However, the exchange coupling force of the γ-Mn alloys is not satisfactory. On the other hand, insulating oxides such as NiO, which have high electric resistances, cannot be directly provided with electrodes in this area, thereby complicating the device construction.

Another related art reference disclosed as U.S. Pat. No. 5,014,147 teaches "An improved thin film magnetoresistance (MR) sensor uses an alloy comprising $Fe_{(1-x)}Mn_x$, where x is within range of 0.3 to 0.4, as an antiferromagnetic layer to provide longitudinal exchange bias in the ferromagnetic MR layer."

Thus, in this related art reference, the FeMn Alloy tends to be corroded and the exchange coupling force of the antiferromagnetic material with the magnetoresistance film degrades over time.

SUMMARY OF THE INVENTION

Antiferromagnetic materials have been used for exchange coupling to a ferromagnetic film so as to reduce Barkhausen noise in a magnetoresistance device. However, the conventional antiferromagnetic materials have drawbacks in corrosive resistance, heat stability, exchange coupling force, and so forth.

An object of the present invention is to solve such problems and to provide an exchange coupled film having an antiferromagnetic thin film with strong exchange coupling force and high corrosive resistance, and to provide a magnetoresistance effect element maintaining a stable output level in a long period of time.

The first embodiment present invention is an exchange coupled film comprising an antiferromagnetic layer comprising $N_{100-z}Mn_z$, where N is at least one element selected from the group consisting of Cu, Ru, Rh, Re, Pd, Pt, Ag, Au, Os, and Ir, and z is in the range of $24 \leq z \leq 75$, and having a tetragonal crystalline structure, and a ferromagnetic layer at least part of which is laminated with the antiferromagnetic layer.

The second embodiment present invention is an exchange coupled film comprising an antiferromagnetic layer comprising $Cr_{100-x}M_x$, where M is at least one element selected from the group consisting of elements of group 3b of the periodic table, Cu, Ru, Rh, Re, Pt, Pd, Ag, Au, Os, Ir, Mn, Fe, Co, and V, and x is in the range of $0<x<30$, and a ferromagnetic layer at least part of which is laminated with the antiferromagnetic layer.

The third embodiment of the present invention is a magnetoresistance effect element comprising a substrate, a ferromagnetic layer formed on the substrate, an antiferromagnetic layer formed on at least part of the ferromagnetic layer, and electrodes formed on the substrate, and the electrodes provide an electric current to the ferromagnetic film.

In the first embodiment of the present invention, when $z<24$, since a Neel temperature becomes lower than the room temperature, the exchange coupling does not take place. When $z>75$, since the atomic % of Mn is large, the corrosive resistance deteriorates. The number z is more preferably in the range of $40<z \leq 70$.

N represents the metal which is preferably used to reduce the Neel temperature of antiferromagnetic layer to a more suitable range of temperature.

When N is at least one selected from the group consisting of Pd and Pt, the number z is preferably in the range of $24 \leq z \leq 35$ or $40<z \leq 75$. When $z<24$, since the Neel temparature becomes lower than the room temperature, the exchange coupling does not take place. When $z>75$, since the atomic % of Mn is large, the corrosive resistance deteriorates. Otherwise, the crystalline structure of $N_{100-z}Mn_z$ (where N is at least one element selected from the group consisting of Pd and Pt) becomes a distorted face-centered cubic crystalline structure. Thus, when the exchange coupled film is formed, a large stress is applied thereto, thereby adversely peeling off the antiferromagnetic film and the ferromagnetic film. The number z is more preferably in the range of $40<z \leq 70$. This metal is preferably used to improve the lattice matching between the antiferromagnetic layer and the ferromagnetic layer.

Part of N may be substituted with at least one element (N') selected from the group of Fe, Co, and Ni. When the amount of substitution is represented by $N_{100-y}N'_y$, the number (atomic %) y is preferably in the range of $0<y<30$. The number Y is more preferably in the range of $1 \leq y \leq 10$. When at least one element selected from the group consisting of Fe, Co, and Ni, a NN' antiferromagnetic phase (such as $Ni_{50}Pt_{50}$, $Fe_{25}Pt_{75}$, or $Fe_{50}Rh_{50}$), a MnN' antiferromagnetic phase (such as $Ni_{50}Mn_{50}$, $Fe_{50}Mn_{50}$, or $Co_{50}Mn_{50}$), or a NN' ferromagnetic phase (such as $Ni_{75}Pt_{25}$, $Co_{50}Pt_{50}$, or $Fe_{50}Pd_{50}$) is formed in the antiferromagnetic film. With a magnetic interaction of such a phase and a $NMn_z$ antiferromagnetic phase, the Neel temperature can be controlled. Part of N may be substituted with rare earth metals and half metals such as As, B, Sn, Sb and graphite.

Part of Mn may be substituted with at least one element (M') selected from the group consisting of transition metals, rare earth metals, and half metals. The amount of substitution is allowable within about 30 atomic %. With this substitution, a NM' ferromagnetic phase, a NM' nonmagnetic phase, a MnM' antiferromagnetic phase, a MnM' ferromagnetic phase, a ferromagnetic phase, a paramagnetic phase, and/or an nonmagnetic phase is formed in the antiferromagnetic film. With an interaction of such a phase and an NMn antiferromagnetic phase, the Neel temperature can be controlled.

In the present invention, a $N_{100-z}Mn_z$ antiferromagnetic film that has a tetragonal crystalline structure is preferably used. With the tetragonal crystalline structure, it was found that the spin directions of atoms can be arranged in plane direction. Thus, high exchange coupling characteristics with a ferromagnetic film could be obtained. In the present invention, the orientation of the film is not specified.

A second aspect of the present invention is an exchange coupled film, comprising an antiferromagnetic film made of $Cr_{100-x}M_x$, and a ferromagnetic film at least part of which is laminated with the antiferromagnetic film.

Since the antiferromagnetic film is mainly made of Cr, the corrosive resistance and the lattice matching between the antiferromagnetic layer and the ferromagnetic layer can be much improved in comparison with an exchange coupled film with an antiferromagnetic film made of $N_{100-z}Mn_z$. In the antiferromagnetic film made of $Cr_{100-x}M_x$, M is at least one element selected from the group consisting of group 3b of the periodic table, Cu, Ru, Rh, Re, Pf, Pd, Ag, Au, Os, Ir, Mn, Fe, Co, and V, and x is in the range of 0<x<30 (atomic %). When x=0, since the Neel temperature becomes around room temperature (311 K.), an exchange coupling force cannot be obtained. On the other hand, when x is 30 or greater, if M is Cu, Ru, Rh, Re, Pt, Pd, Ag, Au, Os, Ir, Mn, Fe, Co, or V, since the Neel temperature becomes a room temperature or below, an exchange coupling force cannot be obtained at room temperature. When x is 30 or greater, if M is one of the elements of group 3b of the periodic table, since the Neel temperature exceeds 800 K., the antiferromagnetic film cannot have unidirectional anisotropy. Thus, a satisfactory large exchange coupling force cannot be obtained. Thus, to obtain a satisfactory large exchange coupling force, the number x is more preferably in the range of $1 \leq x \leq 10$.

In the second aspect of the present invention, M is preferably one selected from the group consisting of the elements of group 3b of the periodic table, the noble metals (Cu, Ru, Rh, Re, Pt, Pd, Ag, Au, Os, Ir), Mn, Fe, Co, and V. When M is at least one element selected from the group consisting of group 3b of the periodic table, the elements are preferably at least one element selected from the group consisting of Al, Ga, and In so as to obtain a satisfactory high exchange coupling force at room temperature. Especially, since the Neel temperature of antiferromagnetic layer can be controlled by Al, Ga or In in more suitable range, a satisfactory of lattice matching, which Cr layer inherently possesses, is realized. Thus, the exchange coupled film provides a high exchange coupling force. In the exchange coupled film of the second embodiment, the crystalline structure is not specified.

In the exchange coupled films according to the present invention, the ferromagnetic film has ferromagnetic characteristics. Although the ferromagnetic film is used for a magnetoresistance effect element, it is preferably a magnetoresistance film made of a permalloy with a small saturated magnetic field, an multilayers film, a spin valve film and a granular magnetic alloy film made of a ferromagnetic metal with a giant magnetoresestance effect (such as Fe, Ni, or Co), an alloy thereof (such as FeNi, FeCo, or FeCoNi), or an alloy thereof containing a third element and a fourth element that contribute to improving magnetic characteristics. The ferromagnetic film may be at least partly laminated with the antiferromagnetic film.

In the exchange coupled films, the film thickness of the antiferromagnetic film is not limited as long as it has antiferromagnetic characteristics. However, to obtain a strong exchange coupling force, the film thickness of the antiferromagnetic film is preferably larger than the film thickness of the ferromagnetic film.

In the first and second aspects of the present invention, an interlayer may be formed at an interface of the antiferromagnetic film and the ferromagnetic film. The interlayer may be made of at least one selected from the group consisting of a γ-Mn alloy, a Co-Cr alloy, Cu, Ru, Rh, Re, Pt, Pd, Ag, Au, Os, and Ir. The thickness of the intermediate film is preferably 5 nm or less. The exchange coupling force between the antiferromagnetic layer and the ferromagnetic layer can be controlled with the interlayer. With the interlayer, the crystalline characteristics of the antiferromagnetic film can be improved. In addition, the intensity of the exchange coupling force can be controlled. When the thickness of the interlayer exceeds 5 nm, if the interlayer is a nonmagnetic phase, the exchange coupling force of the antiferromagnetic film and the ferromagnetic film becomes weak.

The exchange coupled films can be fabricated, for example, on a substrate by a known film forming method such as evaporation, sputtering, or MBE. In this case, the antiferromagnetic film may be formed and heated in a magnetic field so as to provide unidirectional anisotropy. The substrate for use with the exchange coupled films is not limited. In other words, the substrate may be an amorphous substrate (such as glass or resin), a single crystal substrate (such as Si, MgO, or a ferrite), an oriented substrate, or a sintered substrate. In addition, a base layer with a thickness ranging from 1 to 100 nm may be formed on the substrate so as to improve crystalline characteristics of the antiferromagnetic film and the ferromagnetic film. The material of the base layer is not limited as long as it improves the crystalline characteristics. Examples of the material of the base layer are noble metals (such as Pd and Pt) and amorphous metals (such as CoZrNb). Although it is preferable that the base layer does not magnetically affect the ferromagnetic layer and the antiferromagnetic layer, it is not always a nonmagnetic substance.

The magnetoresistance effect element of this invention can be easily produced by forming electrodes which provide an electric current to the ferromagnetic layer, using a material such as Cu, Ag, Au, Al, or alloys thereof. The electrodes are directly in contact with the ferromagnetic layer or are in contact through the antiferromagnetic layer.

Thus, the exchange coupled films can be applied for various devices using magnetoresistance effect element such as magnetic field detecting sensors and reproducing magnetic heads.

In the magnetoresistance effect element in of the present invention, the exchange coupling force between the antiferromagnetic layer and the ferromagnetic layer contribute to suppress the Barkhausen Noise in the ferromagnetic layer, and to fix the magnetization of the multilayers film or spin valve film.

In addition, when the exchange coupled films according to the present invention comprise a $N_{100-z}Mn_z$ or $Cr_{100-x}M_x$ antiferromagnetic film, they provide high exchange coupling characteristics and high corrosive resistance.

DESCRIPTION OF THE PREFERRED EMBODIMENTS

Embodiment 1

Figure 1:
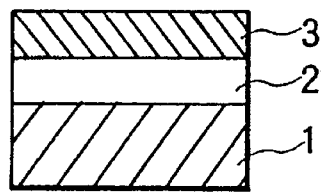
FIG. 1 is a sectional view showing an exchange coupled film according to the present invention.

With an RF magnetron sputtering apparatus, an exchange coupled film made of an antiferromagnetic film and a ferromagnetic film was fabricated. FIG. 1 shows a cross section of the exchange coupled film. A 30 nm thick ferromagnetic film 2 made of $Ni_{80}Fe_{20}$ (80 atomic % of Ni and 20 atomic % of Fe) and a 30 nm thick antiferromagnetic film 3 made of $Pd_{100-z}Mn_z$ (where z=20, 24, 41, 50, 75, 80) were formed on a glass substrate 1 in a magnetic field, respectively. At that point, the substrate 1 was not heated.

The fabricated antiferromagnetic film was X-ray diffracted so as to determine the crystalline structure and orientation thereof. It was verified that the crystalline structure of the fabricated antiferromagnetic film was tetragonal and the orientation thereof was (101).

Figure 2:
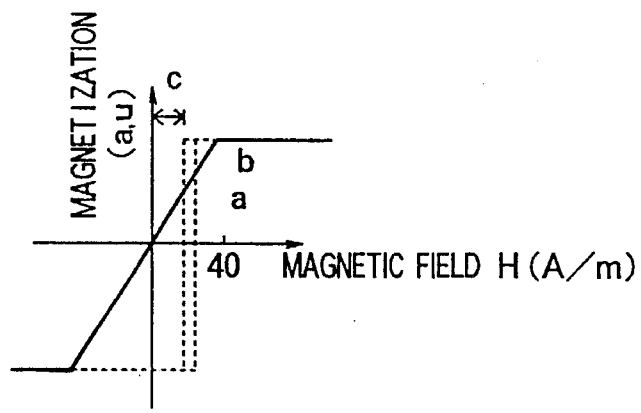
FIG. 2 is a graph showing a magnetization curve of Embodiment 1 of the present invention.

FIG. 2 shows a magnetization curve of an antiferromagnetic film composed of $Pd_{50}Mn_{50}$. In FIG. 2, the magnetization curve has an easy axis a (where the exchange coupled film is magnetized) and a hard axis b. The difference c between the intensity of the magnetic field of the easy axis a and the intensity of the magnetic field of the hard axis b is an exchange bias magnetic field (Hua).

Figure 3:
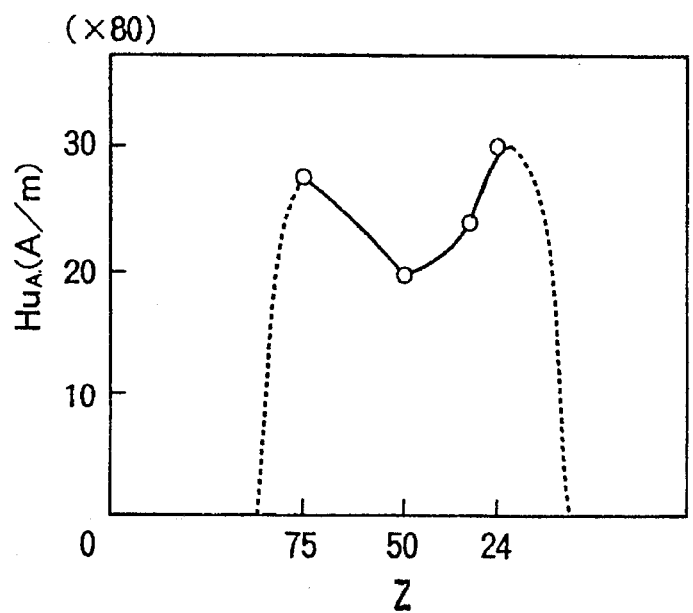
FIG. 3 is a graph showing the relation between compositions according to Embodiment 1 and their intensity of exchange bias magnetic field.

FIG. 3 shows the relation between the number z of Mn and the intensity of the exchange bias magnetic field. As is clear from FIG. 3, when the number z is in the range of $24 \leq z \leq 75$, the intensity of the exchange bias magnetic field of the antiferromagnetic film of this Embodiment is 1600 (A/m) or greater, which is not inferior to the intensity of the exchange bias magnetic field of the conventional antiferromagnetic film made of γ-FeMn. On the other hand, when the number z is out of such a range, the intensity of the exchange bias magnetic field showed a remarkably lower value.

When the number z was in the range of $35 \leq z \leq 40$, although the exchange coupled film according to this example had a high intensity of the excellent exchange bias magnetic field, the antiferromagnetic film was peeled off from the ferromagnetic film.

Table 1 shows the intensity of the exchange bias magnetic field generated by exchange coupled films formed of a 40 nm thick antiferromagnetic film and a 10 nm thick ferromagnetic film. As is clear from Table 1, even if the composition of the antiferromagnetic film and ferromagnetic film was changed, a high intensity of the exchange bias magnetic field could be obtained.

In addition, Table 1 shows that the Neel temperature $T_N$ of the antiferromagnetic film. As is clear from Table 1, the Neel temperature of the $N_{100-z}Mn_z$ antiferromagnetic film made of Rh, Ru as N is value lower value than that of Pd, Pt as N.

TABLE 1

| Antiferromagnetic film | | | Exchange bias |
|---|---|---|---|
| Composition | $T_N$ (°C.) | Ferromagnetic film Composition | magnetic field (A/m) |
| $Pt_{50}Mn_{50}$ | 700 | $Ni_{80}Fe_2$ | 560 |
| $Pt_{58}Mn_{42}$ | 630 | | 1200 |
| $Pt_{67}Mn_{33}$ | 430 | | 1600 |
| $(Pt_{50}Pd_{50})_{58}Mn_{42}$ | 430 | | 1600 |
| $Pt_{58}Mn_{42}$ | 630 | $Co_{90}Fe_{10}$ | 800 |
| $Pd_{50}Mn_{50}$ | 500 | | 1200 |
| $(Pt_{50}Pd_{50})_{58}Mn_{42}$ | 350 | | 1440 |
| $Rh_{60}Mn_{40}$ | 150 | | 1040 |
| $Ru_{60}Mn_{40}$ | 37 | | 96 |
| $(Rh_{50}Pd_{50})_{60}Mn_{40}$ | 410 | | 720 |

Embodiment 2

In the same manner as Embodiment 1, a 30 nm thick $Ni_{80}Fe_{20}$ (80 atomic % of Ni and 20 atomic % of Fe) layer as a ferromagnetic film and a 30 nm thick $(Pd_{100-y}N'_y)_{58}Mn_{42}$ layer (where N' is at least one selected from the group consisting of Fe, Ni, and Co; and 0<y<30) as an antiferromagnetic film were formed on a glass substrate. Thus, the exchange coupled film according to Embodiment 2 was obtained. Thereafter, the intensity of the exchange bias magnetic field of each of the resultant exchange coupled films was measured. It was verified that the intensity of the exchange bias magnetic field of each of the exchange coupled films was 500 (A/m) or greater.

Figure 4:
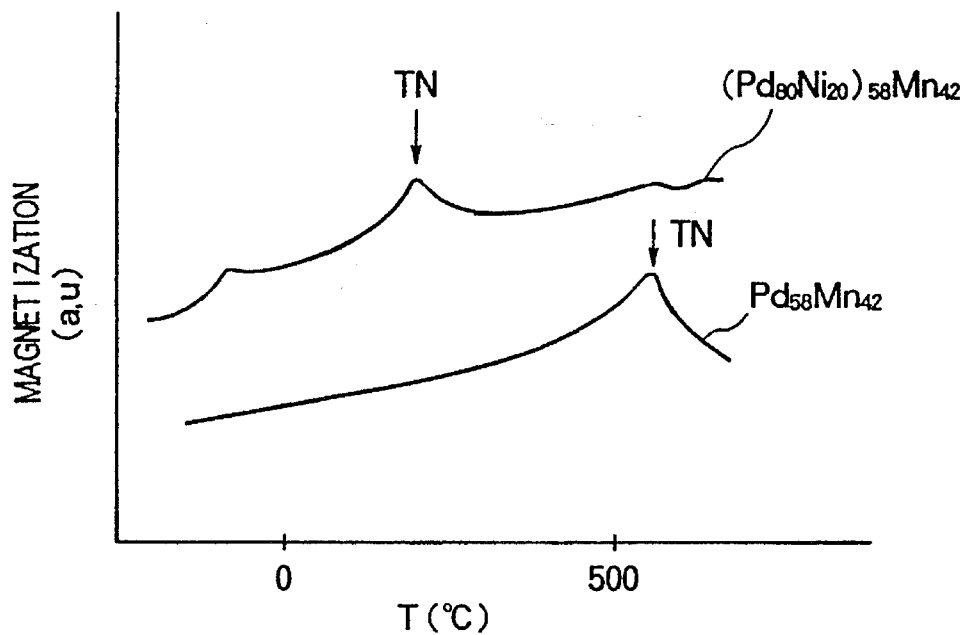
FIG. 4 is a graph showing the relation between magnetization according to Embodiment 2 of the present invention and temperature.
Figure 5:
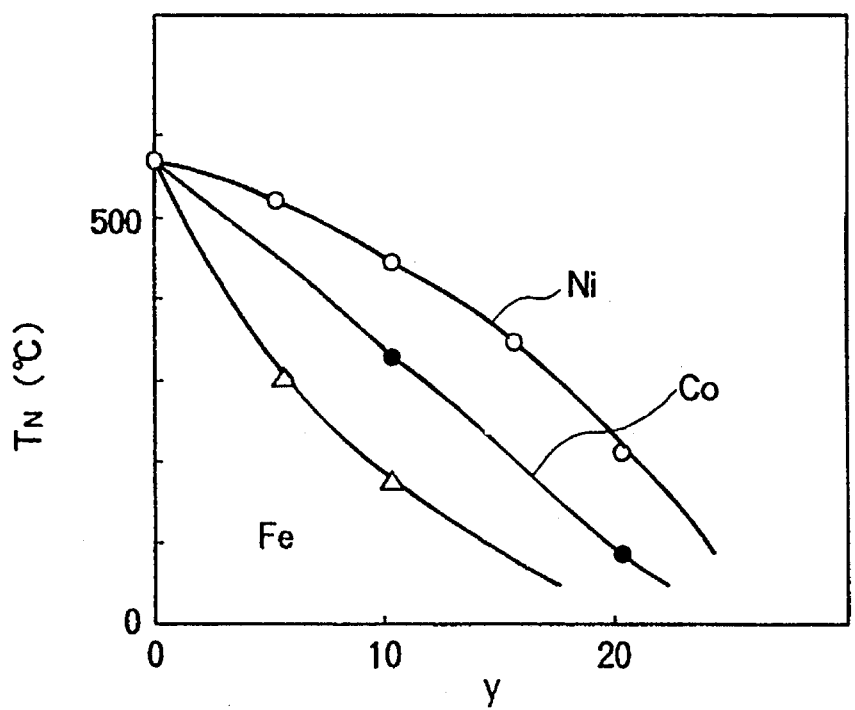
FIG. 5 is a graph showing the relation between compositions according to Embodiment 2 of the present invention and their Neel temperature.

In addition, the magnetization, which varies as a function of temperature, and the Neel temperature of each of the exchange coupled films was measured. FIG. 4 shows the magnetization of $(Pd_{80}Ni_{20})_{58}Mn_{42}$ and $Pd_{58}Mn_{42}$ as a function of temperature. In FIG. 4, the peak of the magnetization represents the Neel temperature $T_N$. FIG. 5 shows the Neel temperature corresponding to each composition. As is clear from FIG. 5, when part of Pd was substituted with at least one element selected from the group consisting of Fe, Ni, and Co, the Neel temperature decreased. For example, when N' was Ni and the number y was 10, the Neel temperature was 440° C., which was by 100° C. lower than 560° C. where the number y was 0. As is clear from FIG. 5, Fe had the highest Neel temperature drop and Co and Ni followed.

When part of Mn was substituted with a transition metal (such as Fe, Co, or Ni), a rare earth metal (such as La, Sm, or Y) or a half metal (such as As, B, Sn, Sb, or graphite) or when part of N and part of Mn were substituted with one of such elements, the Neel temperature decreased. After the exchange coupled films according to this Embodiment had been left in an atmosphere with a relative humidity of 90% and a temperature of 90° C. for 48 hours, the intensity of the exchange bias magnetic field of each of the exchange coupled films was 90% or greater of their initial values.

Embodiment 3

In the same manner as Embodiment 1, a 30 nm thick $Ni_{80}Fe_{20}$ layer as ferromagnetic material and 30 nm thick $Pt_{58}Mn_{42}$ as an antiferromagnetic material were formed on each of substrates of a MgO (100), a MgO (110), a MgO (111), a sapphire C, and a glass. Thus, the exchange coupled film according to Embodiment 3 was obtained. The intensity of the exchange bias magnetic field of each of the exchange coupled bias films fabricated was measured. As a comparative example, the intensity of the exchange bias magnetic field of an exchange coupled film with an antiferromagnetic film made of γ-FeMn was measured.

Experimental results show that when an antiferromagnetic film was made of $Pt_{58}Mn_{42}$, an exchange bias magnetic field was measured regardless of the type of a substrate. However, with an antiferromagnetic film made of γ-FeMn, an exchange bias magnetic field was measured only when a substrate was MgO (111), sapphire C surface, and glass. This is because $Pt_{58}Mn_{42}$ according to the present invention has a tetragonal crystalline structure. In other words, a high intensity of the exchange bias magnetic field could be obtained, only when an antiferromagnetic film is made of γ-FeMn having a face-centered cubic crystalline (111) structure. However, $N_{100-z}Mn_z$ according to the present invention does not need to define the orientation.

In addition, the intensity of the exchange bias magnetic field of an exchange coupled film with an antiferromagnetic film made of γ-PtMn was measured in the same manner. In this case, the exchange bias magnetic field of this exchange coupled film was measured only on a particular surface as with the case of γ-FeMn. In addition, the intensity of the exchange bias magnetic field was approximately 100 (A/m), which was not satisfactory for an exchange coupled film.

Embodiment 4

Figure 6:
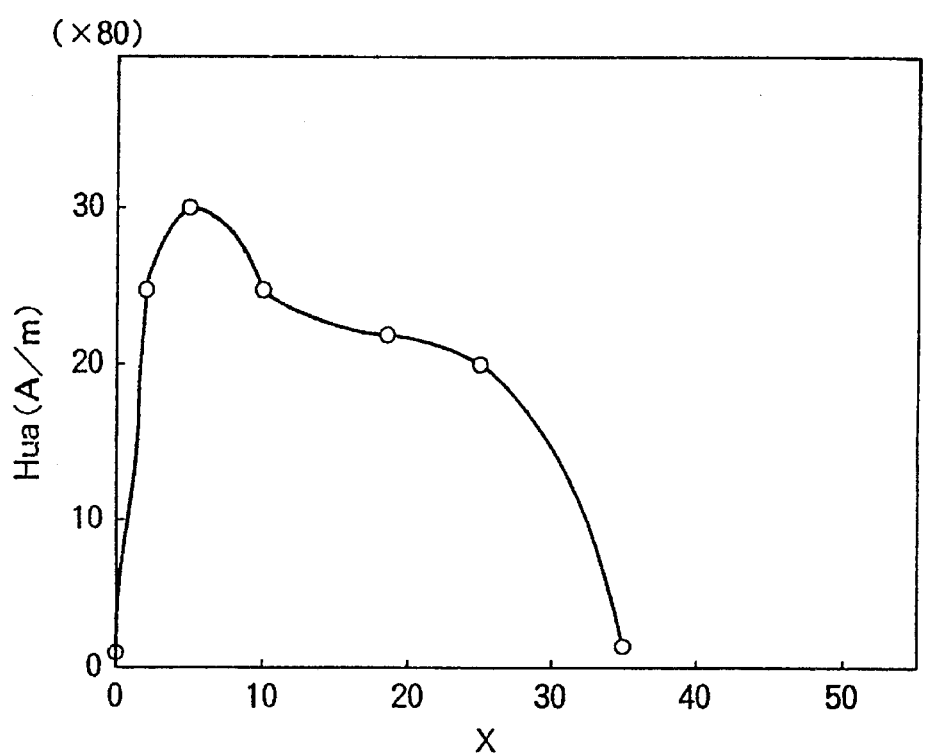
FIG. 6 is a graph showing the relation between compositions according to Embodiment 4 of the present invention and their intensity of exchange bias magnetic field.

In the same manner as the embodiment 1, an exchange coupled film was formed of a 10 nm thick $Co_{85}Fe_8Pd_7$ (85 atomic % of Co, 8 atomic % of Fe, and 7 atomic % of Pd) layer as a ferromagnetic film and a 40 nm thick $Cr_{100-x}Al_x$ (where x=0, 2, 5, 10, 18, 25, or 35) layer as an antiferromagnetic film. Thus, the exchange coupled film according to Embodiment 4 was obtained. FIG. 6 shows the relation between the amount x, of Al of each of the exchange coupled films and the intensity of the exchange bias magnetic field. As is clear from FIG. 6, when the amount x, of Al was in the range of 0<x<30, the intensity of the exchange bias magnetic field was not inferior to the intensity of exchange bias magnetic field of the conventional antiferromagnetic film made of γ-FeMn. And when the amount x, of Al was in the range of 1≦x≦10, the intensity of the exchange bias magnetic field was 2000 (A/m) or greater. On the other hand, when the number x was out of such a range, the intensity of the exchange bias magnetic field was not greater than 160 (A/m). In addition, the intensity of the exchange bias magnetic field of each of exchange coupled films where Al of the antiferromagnetic film was substituted with Ga, In, or Re was measured in the same manner as the Embodiment 4. Experimental results show that when the antiferromagnetic film contains Al, these exchange coupled films satisfactorily generate an exchange bias magnetic field.

Embodiment 5

Figure 7:
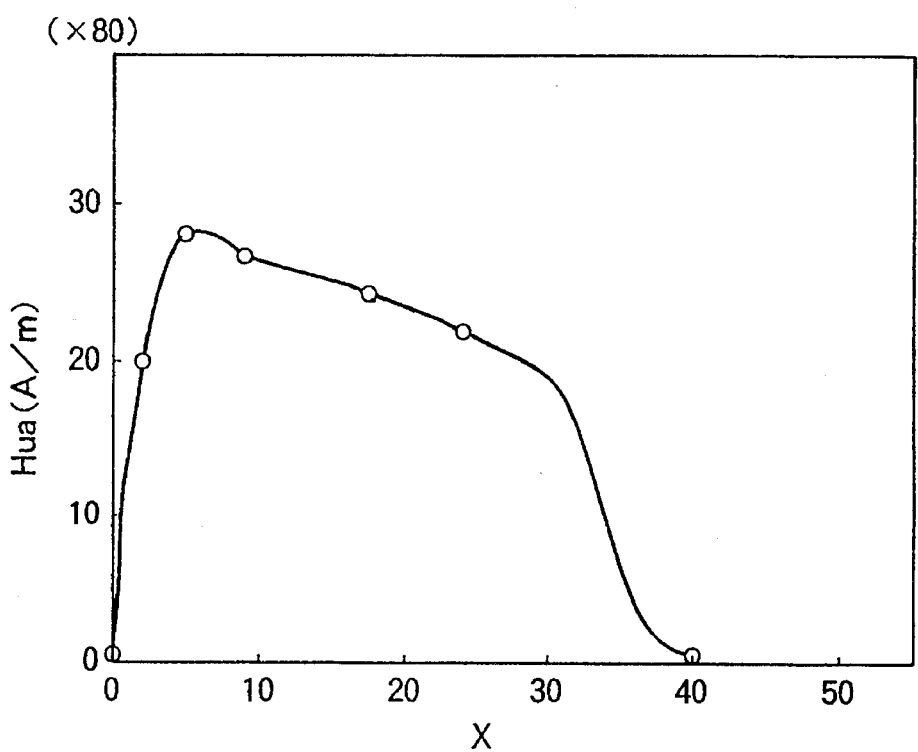
FIG. 7 is a graph showing the relation between compositions according to Embodiment 5 of the present invention and their intensity of exchange bias magnetic field.

In the same manner as Embodiment 1, exchange coupled films were formed of a 10 nm thick $Co_{89}Fe_9Pd_2$ (89 atomic % of Co, 9 atomic % of Fe, and 2 atomic % of Pd) layer as a ferromagnetic layer and a 40 nm thick $Cr_{100-x}V_x$ (where x=0, 1, 5, 10, 18, 25, or 40) layer as an antiferromagnetic film. Thus, the exchange coupled film according to Embodiment 5 was obtained. FIG. 7 shows the relation between the number of x of Mn and the intensity of the exchange bias magnetic field. As is clear from FIG. 7, when the amount x of V was in the range of 0<x<30, the intensity of the exchange bias magnetic field was not inferior to the intensity of exchange bias magnetic field of the conventional antiferromagnetic film made of γ-FeMn. And when the amount x, of V was in the range of 1≦x≦10, the intensity of the exchange bias magnetic field was 1600 (A/m) or greater. On the other hand, when the number x was out of such a range, the intensity of the exchange bias magnetic field was not greater than 160 (A/m). In addition, the intensity of the exchange bias magnetic field of each of exchange coupled films where V of the antiferromagnetic film was substituted with Fe, Co, Au, Rh or Mn was measured in the same manner as the Embodiment 5. In each of the exchange coupled films in the range of 0<x<30, the intensity of the exchange bias magnetic field was similar to that of the exchange coupled films with the antiferromagnetic film containing V.

Embodiment 6

Figure 8:
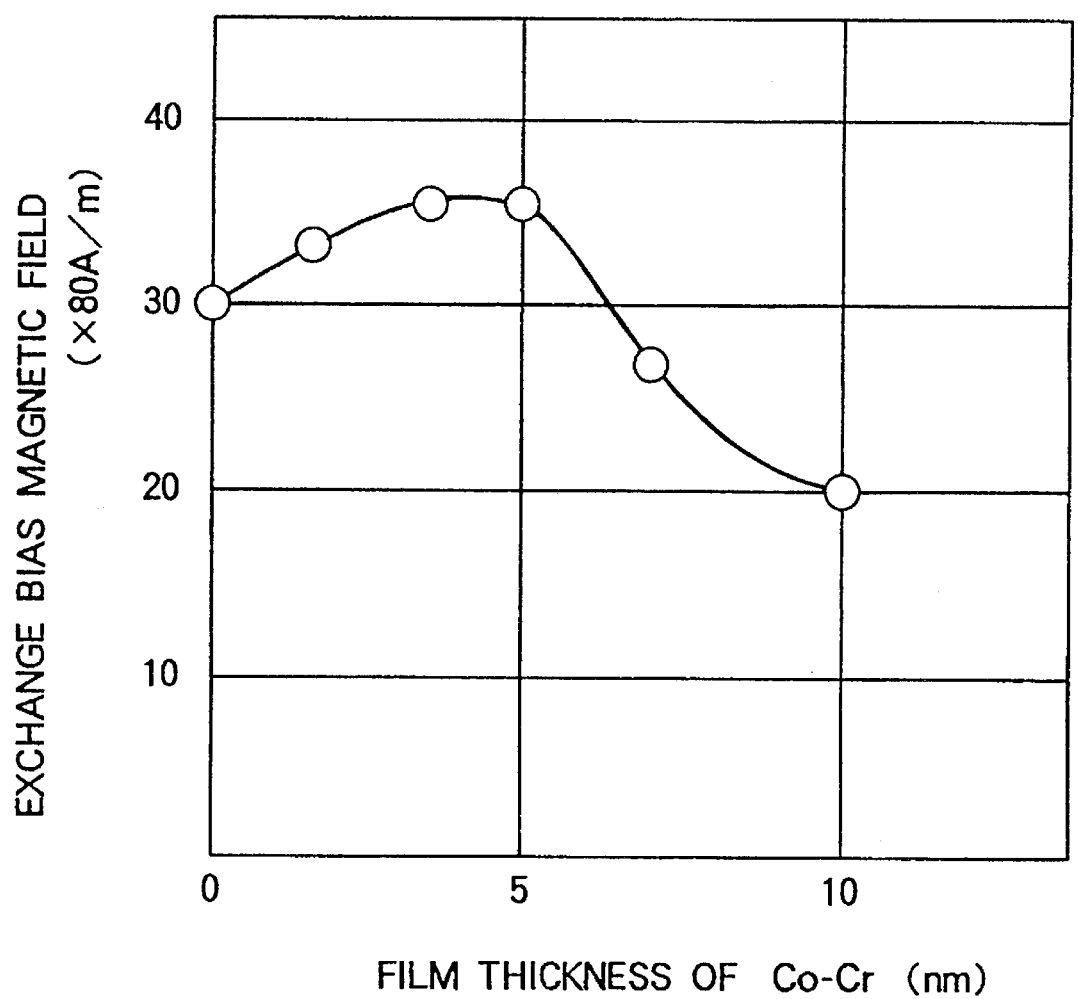
FIG. 8 is a graph showing the relation between the thickness of Co-Cr alloy film and the intensity of exchange bias magnetic field.

In the same manner as Embodiment 1, an exchange coupled film was formed. In this Embodiment, a (up to 10 nm thick) Co-Cr alloy film as an interlayer was disposed between a 10 nm thick $Co_{85}Fe_8Pd_7$ (85 atomic % of Co, 8 atomic % of Fe, and 7 atomic % of Pd) layer as a ferromagnetic film and a 30 nm thick $Cr_{98}Al_2$ layer as an antiferromagnetic film. Thus, the exchange coupled film according to Embodiment 6 was obtained. The intensity of the exchange bias magnetic field of the fabricated exchange coupled film was measured. FIG. 8 shows the relation between the film thickness of the Co-Cr alloy and the intensity of the exchange bias magnetic field.

In FIG. 8, when a 5 nm Co-Co alloy film was formed as an interlayer, the intensity of the exchange bias magnetic field was greater than 2400 (A/m) (=30(Oe)) of an exchange coupled film without such an interlayer. However, as the film thickness of the interlayer exceeded 5 nm, the intensity of the exchange bias magnetic field decreased. When the film thickness of the interlayer was 10 nm, the intensity of the exchange bias magnetic field was 1600 (A/m) (=20(Oe)). Thus, when an interlayer with a thickness of 5 nm or less was formed, the intensity of the exchange bias magnetic field was improved. In the same manner, the intensity of the exchange bias magnetic field of each of the exchange coupled films with an interlayer made of γ-Mn alloy or at least one element selected from the group consisting of Cu, Ru, Rh, Re, Pt, Pd, Ag, Au, Os, and Ir was measured. Experimental results show that the effects of these modifications were the same as the effects of Embodiment 6.

Embodiment 7

Figure 9:
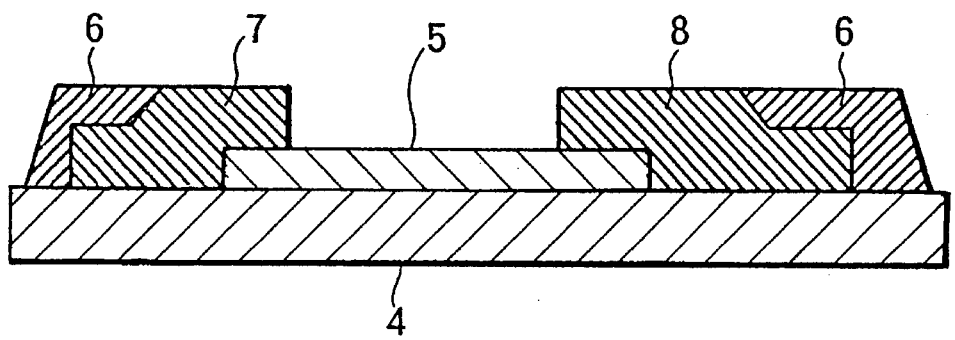
FIG. 9 is a sectional view showing a magnetoresistance effect element in the present invention.

With the exchange coupled film having sufficient intensity of the exchange bias magnetic field in Embodiment 1 (namely, the antiferromagnetic film made of $Pd_{50}Mn_{50}$), a magnetoresistance effect element according to the present invention was fabricated. FIG. 9 shows a cross section of the magnetoresistance effect element. #7059 Glass (Corning Japan Co., LTD.) was used as a substrate 4. Two layers of a 20 nm $Ni_{80}Fe_{20}$ (80 atomic % of Ni and 20 atomic % of Fe) and a 10 nm $Co_{90}Fe_{10}$ (90 atomic % of Co and 10 atomic % of Fe) were used as a ferromagnetic film 5. A 20 μm Cu film was used as electrodes 6. The distance between an antiferromagnetic film 7 and an antiferromagnetic film 8 was 0.1 mm. The ferromagnetic film 5, the antiferromagnetic film 7, 8 were formed in a magnetic field so that they had unidirectional anisotropy and the ferromagnetic film 5 had a single magnetic domain. Thereafter, with a conventional semiconductor manufacturing process, a magnetoresistance effect element was obtained.

The magnetoresistance effect element was exposed to an outer magnetic field and the magnetic field response characteristics were measured. Experimental results show that the stable output level of the magnetoresistance effect element according to this Embodiment was similar to that of a magnetoresistance effect element employing an antiferromagnetic film made of γ-FeMn with a protective film made of Ti or the like. Moreover, in the magnetoresistance device according to this Embodiment, Barkhausen noise caused by the movement of the domain walls did not take place.

Embodiment 8

In the same manner as the Embodiment 1, exchange coupled films were formed of an $Ni_{80}Fe_{20}$ (80 atomic percent of Ni and 20 atomic % of Fe) layer as a ferromagnetic film and an antiferromagnetic film made of $Pd_{50}Mn_{50}$, $Pd_{67}Mn_{33}$, $Pt_{50}Mn_{50}$, $Cr_{95}Al_5$, $Cr_{90}Ga_{10}$, and $Cr_{98}Mn_2$. As comparative examples, exchange coupled films were formed employing an antiferromagnetic film made of $Pt_{17}Mn_{33}$, $Pd_{20}Mn_{80}$, $Cr_{50}Mn_{50}$, $Pd_{23}M_{77}$, or conventional γ-FeMn.

Figure 10:
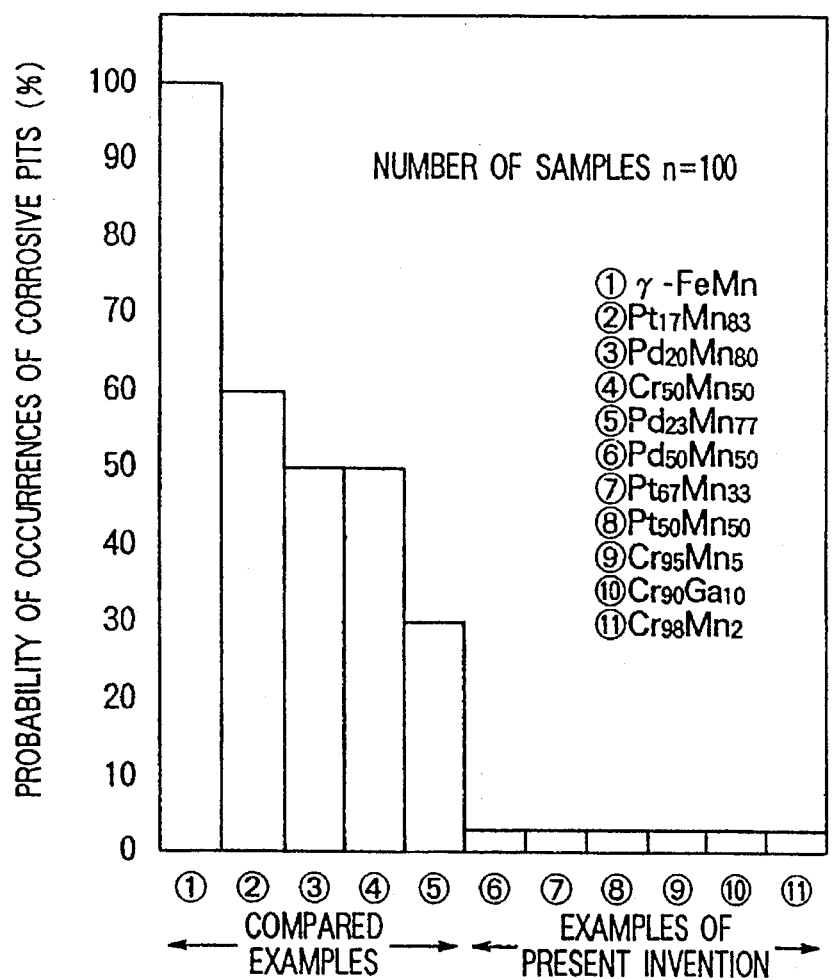
FIG. 10 is a graph showing occurrences of corrosive pits, in the exchange coupled film.

Each of the exchange coupled films fabricated was left in an atmosphere with a relative humidity of 90% and a temperature of 90° C. for 48 hours. Thereafter, occurrences of corrosive pits were verified. FIG. 10 shows the measurement results. As is clear from FIG. 10, in the exchange coupled films according to the present invention, the probability of occurrences of corrosive pits was very low and corrosive pits almost did not take place. Thereafter, the intensity of the exchange bias magnetic field of each of these exchange coupled films was measured. Measured results show that the intensity of the exchange bias magnetic field of each of the exchange coupled films with $Pt_{17}Mn_{83}$, $Pd_{20}Mn_{80}$, $Cr_{50}Mn_{50}$, $Pd_{23}Mn_{77}$ according to the comparison examples was 50% of the initial value; the intensity of the conventional exchange coupled film with γ-FeMn was 10% of the initial value; and the intensity of film according to the Embodiment 8 was 90% or higher than the initial value.

What is claimed is:

1. A magnetoresistance effect element, comprising:

a substrate;

an exchange coupled film, formed on said substrate, comprising an antiferromagnetic layer and a ferromagnetic layer at least part of which is laminated with said antiferromagnetic layer;

electrodes for providing an electric current to said ferromagnetic layer, wherein said antiferromagnetic layer comprises $Cr_{100-x}M_x$, where M is at least one selected from the group consisting of Ga, In, Cu, Rh, Pt, Pd, Ag, Os, Ir, and Co; and x is in the range of 0<x<30.

2. The magnetoresistance effect element as set forth in claim 1, wherein said electrodes comprise at least one selected from the group consisting of Cu, Ag, Au, Al and alloys thereof.

3. The magnetoresistance effect element as set forth in claim 1, wherein x is in the range of $1 \leq x \leq 10$.

4. The magnetoresistance effect element as set forth in claim 1, wherein M is Co.

5. The magnetoresistance effect element as set forth in claim 4, wherein x is in the range of $1 \leq x \leq 10$.

6. The magnetoresistance effect element as set forth in claim 1, wherein M is at least one selected from the group consisting of Cu, Rh, Pt, Pd, Ag, Os, and Ir.

7. The magnetoresistance effect element as set forth in claim 6, wherein x is in the range of $1 \leq x \leq 10$.

8. The magnetoresistance effect element as set forth in claim 1, wherein said antiferromagnetic layer has a Neel temperature in the range of 100°–500° C.

9. The magnetoresistance effect element as set forth in claim 1, wherein a thickness of said antiferromagnetic layer is larger than that of said ferromagnetic layer.

10. The magnetoresistance effect element as set forth in claim 1, further comprising:

an interlayer disposed at an interface of said antiferromagnetic layer and said ferromagnetic layer, said interlayer being made of at least one selected from the group consisting of a γ-Mn alloy, a Co-Cr alloy, Cu, Ru, Rh, Re, Pt, Pd, Ag, Au, Os, and Ir, wherein the thickness of said interlayer is 5 nm or less.

* * * * *

UNITED STATES PATENT AND TRADEMARK OFFICE
CERTIFICATE OF CORRECTION

PATENT NO. : 5,552,949
DATED : September 03, 1996
INVENTOR(S) : Susumu HASHIMOTO et al.

It is certified that error appears in the above-indentified patent and that said Letters Patent is hereby corrected as shown below:

Claim 2, Column 10, Line 23, "A1" should read --Al--.

Signed and Sealed this

Fourth Day of February, 1997

Attest:

BRUCE LEHMAN

*Attesting Officer*     *Commissioner of Patents and Trademarks*